(12) United States Patent
Xiong et al.

(10) Patent No.: US 9,605,336 B2
(45) Date of Patent: Mar. 28, 2017

(54) MASK, METHOD FOR MANUFACTURING THE SAME AND PROCESS DEVICE

(71) Applicants: Shanghai Tianma AM-OLED Co., Ltd., Shanghai (CN); Tianma Micro-Electronics Co., Ltd., Shenzhen (CN)

(72) Inventors: Zhiyong Xiong, Shanghai (CN); Dong Qian, Shanghai (CN); Yunyan Wei, Shanghai (CN)

(73) Assignees: SHANGHAI TIANMA AM-OLED CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 14/515,434

(22) Filed: Oct. 15, 2014

(65) Prior Publication Data

US 2015/0376765 A1    Dec. 31, 2015

(30) Foreign Application Priority Data

Jun. 30, 2014  (CN) .......................... 2014 1 0307668

(51) Int. Cl.
| | | |
|---|---|---|
| *H01L 21/18* | (2006.01) | |
| *H01L 21/34* | (2006.01) | |
| *H01L 21/027* | (2006.01) | |
| *C23C 14/04* | (2006.01) | |

(52) U.S. Cl.
CPC .................................. *C23C 14/042* (2013.01)

(58) Field of Classification Search
CPC ......... H01L 21/26586; H01L 21/30604; C23C 14/042; C23C 14/24

USPC ................................... 438/510; 257/E21.219
See application file for complete search history.

(56) References Cited

U.S. PATENT DOCUMENTS

| | | | |
|---|---|---|---|
| 6,537,844 B1 | 3/2003 | Itoh | |
| 2004/0003775 A1* | 1/2004 | Kim .......................... | G03F 1/20 118/504 |
| 2004/0104197 A1* | 6/2004 | Shigemura ............ | C23C 14/042 216/20 |
| 2005/0199580 A1* | 9/2005 | Yang ..................... | C23C 14/042 216/12 |
| 2005/0250228 A1* | 11/2005 | Ko ......................... | C23C 14/042 438/21 |
| 2007/0159048 A1* | 7/2007 | Chang .................... | H05B 33/10 313/403 |
| 2011/0146575 A1* | 6/2011 | Choi ..................... | C23C 14/243 118/721 |

(Continued)

FOREIGN PATENT DOCUMENTS

| | | |
|---|---|---|
| CN | 103911583 A | 7/2014 |
| DE | 102009043442 A | 4/2010 |

(Continued)

*Primary Examiner* — Moazzam Hossain
(74) *Attorney, Agent, or Firm* — Alston & Bird LLP

(57) ABSTRACT

A mask and a method of making the mask are disclosed. The mask includes a transition region including at least one first region having a first thickness, and an active region having another thickness, where the thickness of the active region is greater than the first thickness. The method of making the mask includes forming a plurality of patterns in a mask body, the patterns being formed in regions of the mask body corresponding with the active region and the transition region of the mask.

12 Claims, 5 Drawing Sheets

(56) References Cited

U.S. PATENT DOCUMENTS

| | | | | |
|---|---|---|---|---|
| 2012/0286648 A1* | 11/2012 | Pang | ................... | H01L 51/5203 |
| | | | | 313/504 |
| 2012/0295379 A1* | 11/2012 | Sonoda | ................. | C23C 14/042 |
| | | | | 438/34 |
| 2013/0071775 A1* | 3/2013 | Prushinskiy | .............. | G03F 1/76 |
| | | | | 430/5 |
| 2013/0133573 A1* | 5/2013 | Joo | ....................... | C23C 14/042 |
| | | | | 118/504 |
| 2014/0230219 A1* | 8/2014 | Lee | ....................... | C23C 14/042 |
| | | | | 29/428 |
| 2014/0374381 A1* | 12/2014 | Ye | ........................... | H01L 51/56 |
| | | | | 216/47 |
| 2015/0236077 A1* | 8/2015 | Huang | ................ | H01L 27/3218 |
| | | | | 257/40 |

FOREIGN PATENT DOCUMENTS

| | | | | |
|---|---|---|---|---|
| JP | WO 2015093304 A1 * | 6/2015 | ........... | B23K 26/066 |
| WO | 2014023041 A1 | 2/2014 | | |

* cited by examiner

MASK, METHOD FOR MANUFACTURING THE SAME AND PROCESS DEVICE

CROSS REFERENCE TO RELATED APPLICATIONS

This application claims the benefit of priority to Chinese Patent Application No. 201410307668.0, filed with the Chinese Patent Office on Jun. 30, 2014 and entitled "MASK, METHOD FOR MANUFACTURING THE SAME AND PROCESS DEVICE", the content of which is incorporated herein by reference in its entirety.

BACKGROUND OF THE INVENTION

An Active Matrix Organic Light Emitting Display (AMO-LED) has advantages such as self-illumination, low power consumption, fast response speed, high contrast and wide angle of view.

In the process of the manufacturing an AMOLED display panel, a portion with gaps of a mask is used to perform evaporation on red (R) pixels, green (G) pixels, and blue (B) pixels, respectively; further, during the evaporation process, a non-evaporation region (i.e., a region in which the evaporation process is not to be performed) is shielded by a portion without gap of the mask. FIG. 1 is a schematic diagram showing the structure of a mask in the prior art. As shown in FIG. 1, a mask 10 includes an active region 11 and a transition region 12. The active region 11, which functions as an evaporation region, corresponds to a display area of the AMOLED display panel; and the transition region 12, which functions as a non-evaporation region, corresponds to a transition area between the AMOLED display panels. The active region 11 further includes gaps 111 formed by etching and used for the evaporation, while the transition region 12 is not etched.

Before the evaporation, a tension force is applied to the mask by a stretching device to stretch the mask with the tension force, and then the flattened mask is welded on a metal frame to maintain a flat state of the whole mask. Because of the structure design of the mask in the prior art, in which the active region 11 includes the gaps 111 formed by etching but the transition region 12 is not etched, the forces applied to the active region 11 and the transition region 12 are distributed unevenly when the mask is applied by the tension force, thus worsening the flatness of the mask. During the evaporation process, the mask with the worsened flatness would cause color mixture in the AMOLED display panel, thereby decreasing the yield of the display panel.

BRIEF SUMMARY OF THE INVENTION

One inventive aspect is a mask. The mask includes a transition region including at least one first region having a first thickness, and an active region having another thickness, where the thickness of the active region is greater than the first thickness.

Another inventive aspect is a process device, including a mask. The mask includes a transition region including at least one first region having a first thickness, and an active region having another thickness, where the thickness of the active region is greater than the first thickness.

Another inventive aspect is a method for manufacturing a mask. The mask includes a transition region including at least one first region having a first thickness, and an active region having another thickness, where the thickness of the active region is greater than the first thickness. The method includes forming a plurality of patterns in a mask body, the patterns being formed in regions of the mask body corresponding with the active region and the transition region of the mask.

BRIEF DESCRIPTION OF THE DRAWINGS

Features, objects and advantages of the present disclosure will become apparent from the following detailed description of nonrestrictive embodiments made with reference to the accompanying drawings below, in which.

DETAILED DESCRIPTION OF THE PREFERRED EMBODIMENTS

The present disclosure will be further illustrated in detail below in conjunction with the accompanying drawings and embodiments. It may be understood that specific embodiments described herein are merely for explaining the present disclosure rather than limiting the present disclosure. Additionally, it is noted that merely partial contents associated with the present disclosure rather than all contents are illustrated in the accompanying drawings for ease of description.

Before the description of technical solutions of the present disclosure, the mask used for evaporation process in manufacturing an AMOLED display panel is illustrated briefly. In manufacturing the AMOLED display panel, an essential process is to attach organic light emitting materials to a substrate by vacuum evaporation. The mask used in the evaporation process may be a fine metal mask, which is a thin metal sheet of which the flatness is poor in an unused state. Therefore, before the evaporation is performed through the mask, a certain tension force is applied to the mask by a stretching device, and then the mask is welded on a metal frame so that the mask is kept flat to perform the evaporation. However, the distribution of the forces applied to the mask that is being stretched, and hence the flatness of the stretched mask, depends on the structure design of the mask.

The mask includes an active region and a transition region, where the active region corresponds to a display area of the AMOLED display panel and functions as an evaporation region; and the transition region corresponds to a transition area between the AMOLED display panels and functions as a non-evaporation region. Further, the active region is provided with gaps, of which the shape, size, arrangement direction, spacing distance, etc., depend on the structure of pixels to be formed in the AMOLED display panel. In the mask, if the active region includes the gaps formed by etching but the transition region is not etched, the forces applied to the active region and the transition region are distributed unevenly during the stretching of the mask, so that the flatness of the stretched mask is worsened.

Figure 1:
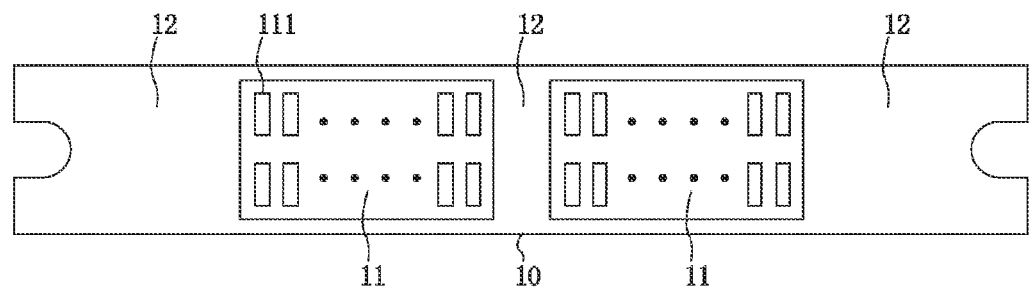
FIG. 1 is a schematic diagram showing the structure of a mask in the prior art.
Figure 2:
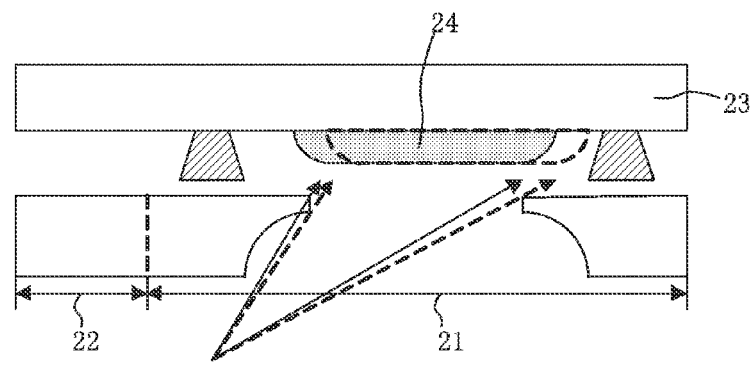
FIG. 2 is a schematic diagram showing an effect of evaporation conducted with a mask with worsened flatness.

FIG. 2 is a schematic diagram showing an effect of evaporation conducted with a mask with worsened flatness. As shown in FIG. 2, the stretched mask is adhered together with substrate 23 in order to perform the evaporation. The mask includes an active region 21 provided with gaps, and a transition region 22 provided around the active region. Since the flatness of the mask is not good due to unevenly distributed forces during the stretching of the mask, the mask with poor flatness is easy to be deformed in the evaporation process, so that the mask is likely separated from a substrate 23 during evaporation process, and hence the position of the formed pixel 24 is deviated. As shown, the pixel 24 indicated with a solid line in FIG. 2 is a pixel 24 formed when the mask is not separated from the substrate 23, i.e., an indeed expected pixel, and a pixel indicated with a dashed line in FIG. 2 is a pixel formed after the mask is separated from the substrate 23, i.e., an indeed undesired pixel; additionally, a solid line with a unidirectional arrow indicates an effective motion direction of the organic light emitting material forming the pixel during evaporation when the mask is not separated from the substrate 23, and a dashed line with a unidirectional arrow indicates an effective motion direction of the organic light emitting material forming the pixel during evaporation after the mask is separated from the substrate 23. The above-mentioned phenomenon will cause color mixture in the AMOLED display panel, thereby decreasing yield of the display panel. In view of this, the first embodiment of the present disclosure provides a technical solution below to avoid such phenomenon.

The first embodiment of the present disclosure provides a mask including an active region and a transition region, and the transition region includes at least one first region having a first thickness which is less than a thickness of the active region.

It is noted that the above first thickness, the thickness of the active region as well as thicknesses involved in the various embodiments of the present disclosure each have a value larger than zero. Since the value of the thickness of the gap (formed by etching through the active region of the mask) included in the active region is zero, the thickness of the active region is a thickness of the portion not etched in the active region, i.e. a thickness of a mask body used for manufacturing the mask. The first thickness is equal to the thickness of the active region minus the thickness of a portion etched from the transition region.

Figure 3:
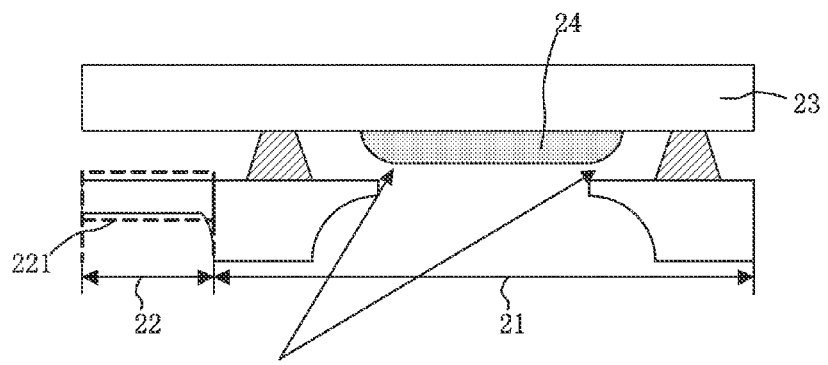
FIG. 3 is a schematic diagram showing an effect of evaporation conducted with a mask provided according to the first embodiment of the present disclosure.

If the transition region of the mask includes at least one first region having the first thickness which is less than a thickness of the active region, when a certain tension force is applied to the mask by a stretching device, the forces applied to the active region and the transition region of the mask may be distributed evenly due to the presence of etched patterns in both the active region and the transition region, so that the flatness of the stretched mask can be improved. FIG. 3 is a schematic diagram showing an effect of evaporation conducted with the mask according to the first embodiment of the present disclosure. As shown in FIG. 3, the stretched mask is adhered together with substrate 23 in order to perform the evaporation. The mask includes an active region 21 and a transition region 22, where the transition region 22 at least includes at least one first region 221 having the first thickness. Since the flatness of the mask is good due to evenly distributed forces during the stretching of the mask, the mask with good flatness is adhered firmly onto the substrate 23 during evaporation process so that the mask is not likely deformed and separated from the substrate 23, so that the position of the pixel 24 will not be deviated, and the pixel 24 may be obtained by the evaporation as indeed desired, so that the color mixture in the AMOLED display panel can be avoided, thus improving yield of the display panel. A solid line with a unidirectional arrow in FIG. 3 indicates an effective motion direction of the organic light emitting material forming the pixel 24 during the evaporation.

With the mask provided in the first embodiment of the present disclosure, the at least one first region having the first thickness is provided within the transition region, with the first thickness of the at least one first region being less than the thickness of the active region, so that forces applied to the active region and the transition region of the mask can be distributed evenly during the stretching of the mask, resulting in the good flatness of the stretched mask; as such, by performing the evaporation with such mask in manufacturing the AMOLED display panel, the color mixture in the manufactured AMOLED display panel can be avoided, thereby improving yield of the display panel.

In the first embodiment above, preferably the first thickness is in a range of 20% to 80% of the thickness of the active region. In designing the first region in the transition region, the value of the first thickness can be chosen as needed. For example, if the transition region is provided with only the first region, a suitable thickness of the first region can be chosen from the above range of the first thickness in order to enable the forces applied to the active region and the transition region to be distributed as evenly as possible during the stretching of the mask; again, if the transition region further includes other regions in addition to the first region, a suitable thickness of the first region can be chosen from the above range of the first thickness additionally considering the thickness of the other regions in order to enable the forces applied to the active region and the transition region to be distributed as evenly as possible during the stretching of the mask.

Based on the above technical principles, the structure of the mask can further be implemented in various specific manners. For example, in addition to the first region having the first thickness, the transition region can further include other regions having a thickness different from the thickness of the first region, as long as the forces applied to the active region and the transition region are distributed evenly and the flatness of the mask can be improved. Some preferable embodiments will be illustrated in detail below.

The second embodiment of the present disclosure further provides a mask. On the basis of the first embodiment, the transition region of the mask according to the present embodiment further includes a second region having a second thickness which is different from the first thickness.

Preferably, the first region and the second region may have a shape selected from a group consisting of a bar shape, a square shape, a circular shape, and a combination of at least two of the above.

Further, the shape of the first region may be different from that of the second region.

Figure 4A:
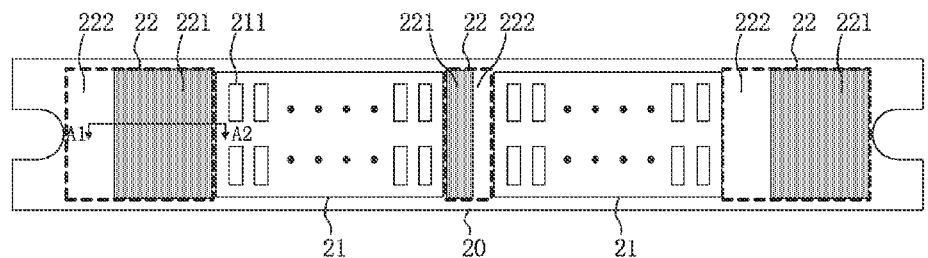
FIG. 4A is a schematic diagram showing the structure of a mask according to a second embodiment of the present disclosure.
Figure 4B:
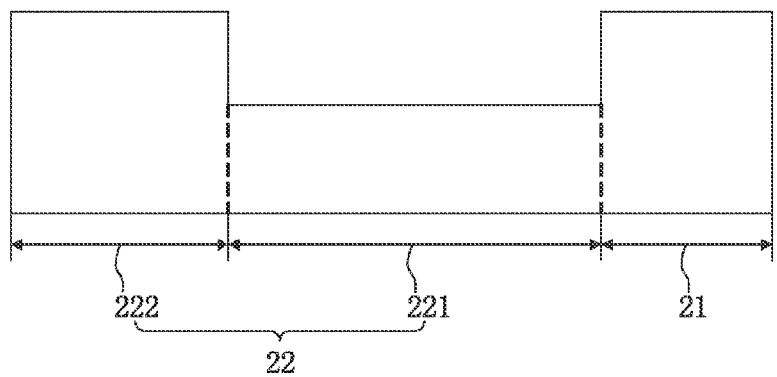
FIG. 4B is a schematic sectional diagram showing the partial structure taken along a line A1-A2 in FIG. 4A.

In the case that the second thickness is different from the first thickness, it is preferable that the second thickness is equal to the thickness of the active region. FIG. 4A is a schematic diagram showing the structure of the mask according to the second embodiment of the present disclosure; and FIG. 4B is a schematic sectional diagram showing the partial structure taken along a line A1-A2 in FIG. 4A. As shown in FIGS. 4A and 4B, the first thickness of the first region 221 (indicated with shadow, which means the first region has a certain thickness without being etched through, and it is the like case hereinafter) in the transition region 22 of the mask 20 is less than the second thickness of the second region 222, and the second thickness is equal to a thickness of the active region 21. It is noted that FIG. 4A shows merely a specific example of the structure of the mask where the second thickness is equal to the thickness of the active region, but other structures of the mask can be obtained depending on the number, size, shape, spacing distance, and arrangement direction of the first regions 221 as well as the value of the first thickness, the position of the first region 221 in the transition region 22, etc., which is not limited herein. It is further noted that the pattern in the active region shown in FIG. 4A and the structure of the mask formed according to the pattern are also merely a specific example of the present disclosure, which is not limited herein. In subsequent various embodiments, the pattern in the active region is illustrated also referring to the pattern shown in FIG. 4A, for example.

Figure 5A:
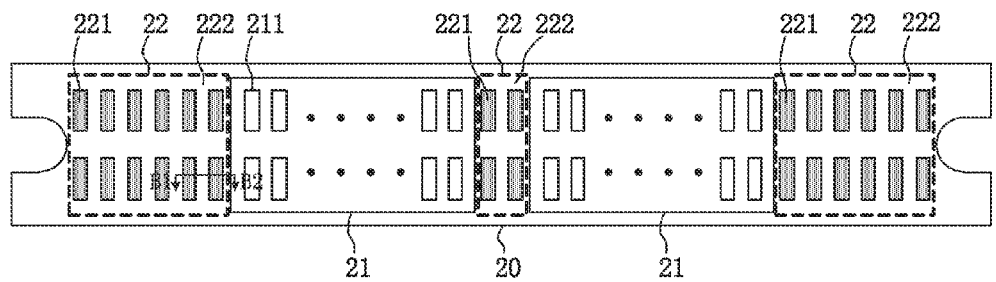
FIG. 5A is a schematic diagram showing the structure of another mask according to the second embodiment of the present disclosure.
Figure 5B:
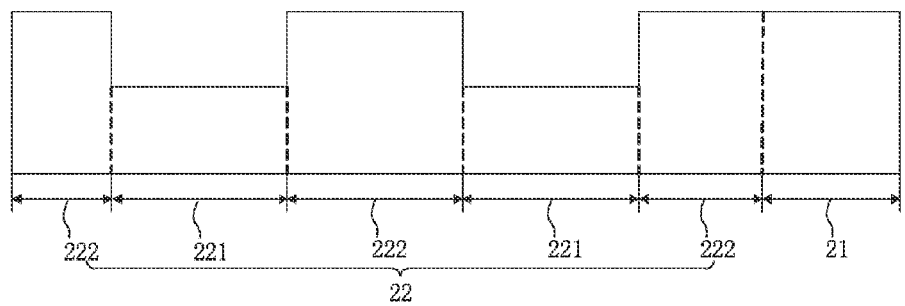
FIG. 5B is a schematic sectional diagram showing the partial structure taken along a line B1-B2 in FIG. 5A.

In the case that the second thickness is equal to a thickness of the active region, preferably the pattern in the first region is consistent with the pattern in the active region in terms of at least one of arrangement direction, spacing distance, shape and size. As mentioned above, the distribution of the forces applied to the active region and the transition region during expansion, and hence the good or poor flatness of the whole mask, depends on the designs of the patterns in both the active region and the transition region of the mask; in addition, the pattern in the active region can be designed in advance according to the structure of pixels in the AMOLED display panel. Therefore, in order for that the force applied to the transition region is as similar as possible to the force applied to the active region, i.e. the forces applied to the active region and the transition region are distributed as evenly as possible, the pattern in the first region is designed to be consistent with the pattern in the active region in terms of at least one of arrangement direction, spacing distance, shape and size. FIG. 5A is a schematic diagram showing the structure of another mask according to the second embodiment of the present disclosure; FIG. 5B is a schematic sectional diagram showing the partial structure taken along a line B1-B2 in FIG. 5A. As shown in FIGS. 5A and 5B, a mask 20 includes an active region 21 and a transition region 22, where the active region 21 is provided with gaps 211, the transition region 22 is provided with first regions 221 and a second region 222, and the arrangement direction, the spacing distance, the shape, and the size of the first regions are consistent with those of the gaps 211 in the active region 21.

Figure 6A:
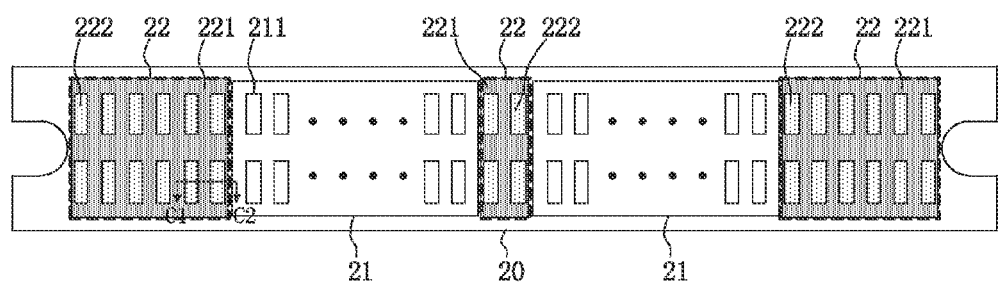
FIG. 6A is a schematic diagram showing the structure of still another mask according to the second embodiment of the present disclosure.
Figure 6B:
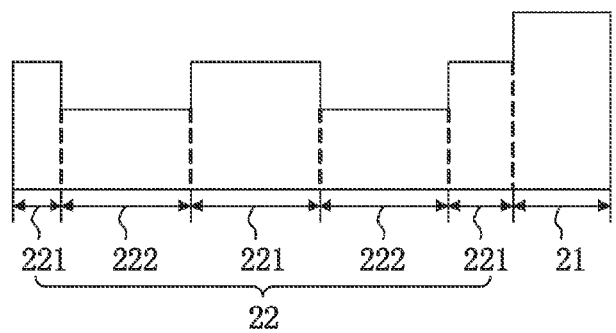
FIG. 6B is a schematic sectional diagram showing the partial structure taken along a line C1-C2 in FIG. 6A.

In the case that the second thickness is different from the first thickness, preferably the second thickness is less than the first thickness, and the pattern in the second region is consistent with the pattern in the active region in terms of at least one of arrangement direction, spacing distance, shape and size. Since the second region in the transition region is also etched, the forces applied to the transition region and the active region can be distributed more evenly when the mask is being stretched, so that the flatness of the stretched mask can be further improved. FIG. 6A is a schematic diagram showing the structure of another mask according to the second embodiment of the present disclosure; and FIG. 6B is a schematic section diagram showing the partial structure taken along a line C1-C2 in FIG. 6A. As shown in FIGS. 6A and 6B, the second thickness of the second region 222 is less than the first thickness of the first region 221, that is, the transition region is further etched compared with the case that the second thickness of the second region 222 is equal to the thickness of the active region 21 as shown in FIG. 4A or 5A, so that the forces applied to the transition region and the active region can be distributed more evenly when the mask is being stretched, thus further improving the flatness of the mask.

Figure 7A:
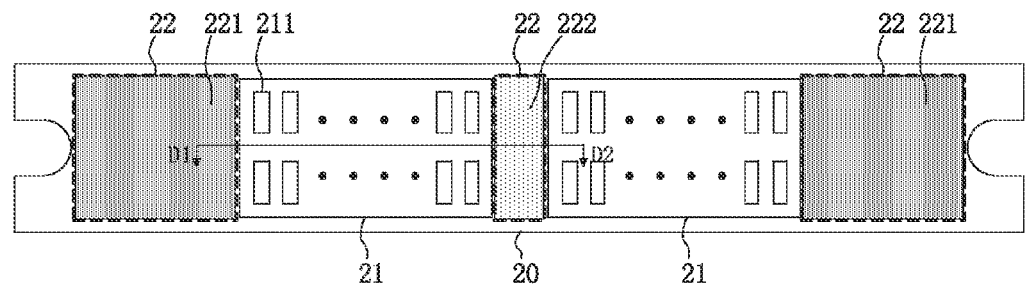
FIG. 7A is a schematic diagram showing the structure of yet another mask according to the second embodiment of the present disclosure.
Figure 7B:
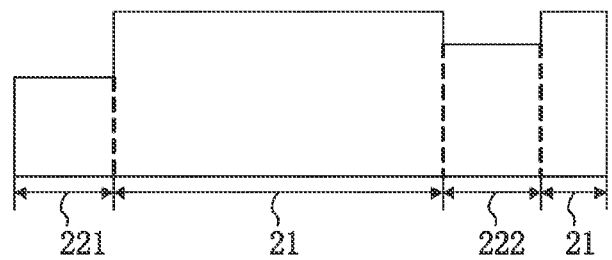
FIG. 7B is a schematic sectional diagram showing the partial structure taken along a line D1-D2 in FIG. 7A.

Preferably, there are at least two active regions which are separately interposed in the transition region, the first region is located at a peripheral area of the mask, the second region is located between the active regions adjacent to each other, the second thickness is larger than the first thickness, and the first thickness is 90% of the second thickness. Further, the second thickness can be in a range of 30% to 85% of the thickness of the active region. FIG. 7A is a schematic diagram showing the structure of still another mask according to the second embodiment of the present disclosure; and FIG. 7B is a schematic section diagram showing the partial structure taken along a line D1-D2 in FIG. 7A. As shown in FIGS. 7A and 7B, the second thickness of the second region 222 is larger than the first thickness of the first region 221, that is, the transition region is further etched compared with the case that the second thickness of the second region 222 is equal to the thickness of the active region 21 shown in FIG. 4A or 5A, so that the forces applied to the transition region and the active region can be distributed more evenly when the mask is being stretched, thereby further improving the flatness of the mask.

Figure 8:
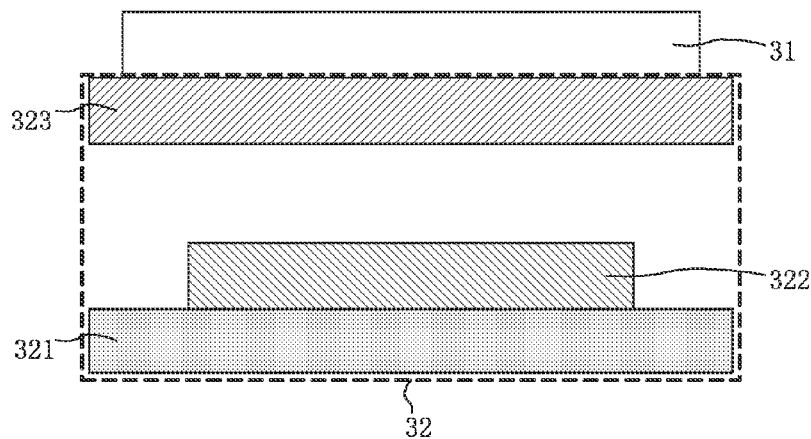
FIG. 8 is a schematic diagram showing the structure of a process device according to a third embodiment of the present disclosure.

The third embodiment of the present disclosure provides a process device. FIG. 8 is a schematic diagram showing the structure of the process device according to the third embodiment of the present disclosure. As shown in FIG. 8, a process device 32 includes a heating device 321, an evaporation source 322, and a mask 323. The process device 32 is configured for performing evaporation on a substrate 31 placed on the mask 323, where the heating device 321 is configured for heating the evaporation source 322; the evaporation source 322 is provided separately from and in parallel with the mask 323 and configured to, when heated to a certain temperature, provide the substrate 31 with an organic light emitting material, so as to form red pixels, green pixels and blue pixels on the substrate 31; the region without the gap in the mask 323 is configured for shielding a non-evaporation region on the substrate 31, and the mask 323 can be any of the masks as provided in the above various embodiments. It is noted that the process device 32 must be disposed within a sealed vacuum space for the purpose of evaporation.

With the process device according to the third embodiment of the present disclosure, by performing evaporation with the mask according to above various embodiments, the color mixture can be avoided in the AMOLED display panel obtained after the evaporation, thereby improving yield of the display panel.

The fourth embodiment of the present disclosure provides a method for manufacturing a mask, which is configured for manufacturing the mask according to any of the above first embodiment and the second embodiment. In the present embodiment, reference may be made to the first embodiment and the second embodiment for the explanation and illustration of the active region and the transition region and so on as well as the description of the related principle, which is not discussed repeatedly herein.

Figure 9:
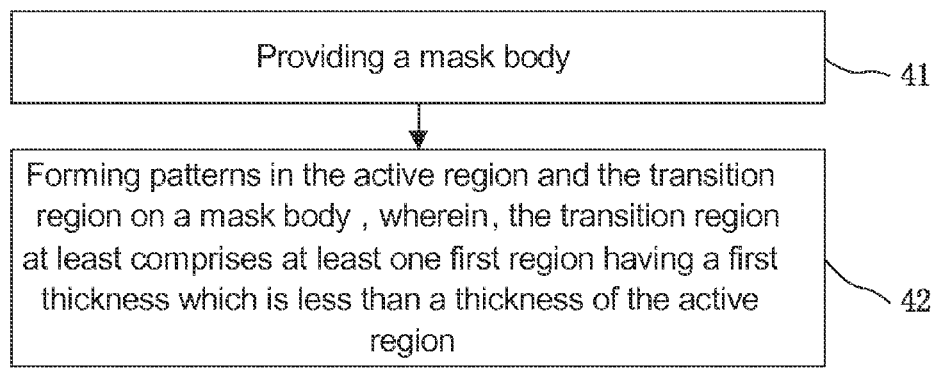
FIG. 9 is a schematic diagram showing a flowchart of a method for manufacturing a mask according to a fourth embodiment of the present disclosure.

FIG. 9 is a schematic diagram showing a flowchart of a method for manufacturing a mask according to the fourth embodiment of the present disclosure. The method for manufacturing a mask includes Steps S41 and S42 below.

Step S41: providing a mask body.

It is noted that the mask body can be a base plate for manufacturing the mask, but no pattern is formed on the base plate.

Step S42: forming patterns in the active region and the transition region of the mask body, where the transition region at least includes at least one first region having a first thickness, which is less than a thickness of the active region.

It is noted that the pattern in the transition region includes the first region having a first thickness, and can also include other regions formed in the transition region and having a thickness different from the first thickness.

To form more patterns in the transition region of the mask, preferably the method for manufacturing the mask further includes: forming at least one second region having a second thickness in the transition region, where the second thickness is different from the first thickness.

Preferably, the forming patterns in the active region and the transition region of the mask body includes forming patterns in the active region and the transition region of the mask body by synchronous etching.

Further, the synchronous etching can be achieved using a partial mask etching process. For example, the pattern in the transition region includes the first region having the first thickness and the second region having the second thickness, where the first thickness is less than the second thickness, the first thickness is 30% of the thickness of the active region, and the second thickness is 60% of the thickness of the active region. To achieve this, forming the first region, the second region, and the pattern in the active region by synchronous etching by using the partial mask etching process may include: coating photoresist on the mask body; providing a photoetching mask, where parts of the photoetching mask respectively corresponding to the pattern in the active region, the first region and the second region have light transmittance of 100%, 60% and 30%, respectively; exposing the photoresist for the first time to expose the mask body at the position of the pattern in the active region, and etching away the mask body at the position of the pattern in the active region by 30% of the thickness of the active region; exposing the photoresist for the second time to further expose the mask body at the position of the first region, and synchronously etching away the mask body at the position of the first region and the positions of the pattern in the active region by 30% of the thickness of the active region; and exposing the photoresist for the third time to further expose the mask body at the position of the second region, and synchronously etching away the mask body at the position of the first region, the position of the second region and the position of the pattern in the active region by 40% of the thickness of the active region, so as to form the first region, the second region and the pattern in the active region. The above illustration is merely an example, and the respective parts of the specific photoetching mask corresponding to patterns in the mask according to the present disclosure and the light transmittance of these parts depend on particular actual conditions, which is not limited herein.

In addition to the partial mask etching process, the synchronous etching can further be achieved by means of controlling etching time. The structure of the above mask is again illustrated for example. Provided that the etching time for forming the pattern in the active region is 100 minutes, then forming the first region, the second region, and the pattern in the active region by synchronous etching by means of controlling etching time may include: firstly etching the mask body at the position of the pattern in the active region for 30 minutes; then synchronously etching the mask body at the position of the first region and the position of the pattern in the active region for 30 minutes; and then synchronously etching the mask body at the position of the pattern in the active region, the position of the first region and the position of the second region for 40 minutes, so as to form the first region, the second region and the pattern in the active region.

With the method for manufacturing the mask according to the fourth embodiment of the present disclosure, at least one first region having the first thickness is formed in the transition region, where the first thickness is less than the thickness of the active region, so that the forces applied to the active region and the transition region of the mask can be distributed more evenly during the stretching of the mask, resulting in the good flatness of the stretched mask. Furthermore, by performing the evaporation with such mask in manufacturing the AMOLED display panel, the color mixture in the manufactured AMOLED display panel can be avoided, thereby improving yield of the display panel.

It is noted that the preferable embodiments and the applied technology principles of the present disclosure are merely described as above. It should be understood for those skilled in the art that the present disclosure is not limited to particular embodiments described herein. Various apparent changes, readjustments and substitutions can be made by those skilled in the art without departing from the scope of protection of the present disclosure. Therefore, although the present disclosure is illustrated in detail through the above embodiments, the present disclosure is not merely limited to the above embodiments, and can further include more of other equivalent embodiments without departing from the conception of the present disclosure. The scope of the present disclosure is subject to the appended claims.

What is claimed is:

1. A mask, comprising:
   a transition region comprising at least one first region having a first thickness; and
   at least two active regions separated by the transition region, wherein a thickness of the active regions is greater than the first thickness;
   wherein each of the active regions corresponds to a whole display area of a display panel and functions as an evaporation region, wherein the transition region corresponds to a transition area between display panels and functions as a non-evaporation region;
   wherein each of the active regions comprises gaps for evaporation and non-etched portion, and wherein the thickness of the active region is equal to the thickness of the non-etched portion.

2. The mask of claim 1, wherein the transition region further comprises at least one second region having a second thickness, wherein the second thickness is different from the first thickness.

3. The mask of claim 2, wherein the second thickness is greater than the first thickness.

4. The mask of claim 3, wherein the second thickness is equal to the thickness of the active region.

5. The mask of claim 2, wherein at least one of the first region and the second region is consistent with a pattern in the active region in terms of at least one of arrangement direction, spacing distance, shape and size.

6. The mask of claim 1, wherein the first thickness is in a range of 20% to 80% of the thickness of the active region.

7. The mask of claim 3, wherein the first region is located at a peripheral area of the mask, wherein the second region is located between the active regions adjacent to each other, wherein the second thickness is less than the thickness of the active region, and wherein the first thickness is 90% of the second thickness.

8. The mask of claim 7, wherein the second thickness is in a range of 30% to 85% of the thickness of the active region.

9. The mask of claim 2, wherein at least one of the first region and the second region has a shape selected from a group consisting of a bar shape, a square shape, a circular shape, and a combination of at least two thereof.

10. The mask of claim 9, wherein the shape of the first region is different from the shape of the second region.

11. The mask of claim 3, wherein at least one of the first region and the second region is consistent with a pattern in the active region in terms of at least one of arrangement direction, spacing distance, shape and size.

12. The mask of claim 4, wherein at least one of the first region and the second region is consistent with a pattern in the active region in terms of at least one of arrangement direction, spacing distance, shape and size.

* * * * *